US008772786B2

(12) United States Patent
Tabatabaie et al.

(10) Patent No.: US 8,772,786 B2
(45) Date of Patent: Jul. 8, 2014

(54) GALLIUM NITRIDE DEVICES HAVING LOW OHMIC CONTACT RESISTANCE

(75) Inventors: Kamal Tabatabaie, Sharon, MA (US); William E. Hoke, Wayland, MA (US); Eduardo M. Chumbes, Andover, MA (US); Kevin McCarthy, Groton, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/548,305

(22) Filed: Jul. 13, 2012

(65) Prior Publication Data

US 2014/0014966 A1   Jan. 16, 2014

(51) Int. Cl.
*H01L 29/15* (2006.01)
*H01L 31/0256* (2006.01)

(52) U.S. Cl.
USPC .......................................................... 257/76

(58) Field of Classification Search
USPC ............... 257/73, 76, 192; 438/172, 483, 513
See application file for complete search history.

(56) References Cited

U.S. PATENT DOCUMENTS

| 7,598,131 | B1 * | 10/2009 | Micovic et al. .............. 438/172 |
| 2003/0062525 | A1 * | 4/2003 | Parikh et al. .................... 257/73 |
| 2007/0020896 | A1 * | 1/2007 | Inoue et al. .................... 438/513 |
| 2008/0173898 | A1 | 7/2008 | Ohmaki |
| 2008/0179631 | A1 | 7/2008 | Kinzer |

FOREIGN PATENT DOCUMENTS

JP   2008210836   9/2011

OTHER PUBLICATIONS

Brown et al., W-Band Power Performance of AlGaN/GaN DHFETs with Regrown n+ GaN Ohmic Contacts by MBE, 2011, IEEE.*
Jia Guo, Yu Cao, Chuanxin Lian, Tom Zimmermann, Guowang Li, Jai Verma, Xiang Gao, Shiping Guo, Paul Saunier, Mark Wistey, Debdeep Jena, Huili (Grace) Xing, Metal-face InAlN/AlN/GaN high electron mobility transistors with regrown ohmic contacts by molecular beam epitaxy, Phys. Status Solidi, A208, No. 7, Feb. 11, 2011, pp. 1617-1619.
A.L. Corrion, K. Shinohara, D. Regan, I. Milosavljevic, P. Hashimoto, P.J. Willadsen, A. Schmitz, D.C. Wheeler, C.M. Butler, D. Brown, S.D. Burnham, M. Micovic, Enhancement-Mode AlN/GaN/AlGaN DHFET With 700-mS/mm g$m$ and 112-GHz f$_T$ IEEE Electron Device Letters, vol. 31, No. 10, Oct. 2010, pp. 1116-1118.

(Continued)

*Primary Examiner* — Vongsavanh Sengdara
*Assistant Examiner* — Ismail Muse
(74) *Attorney, Agent, or Firm* — Daly, Crowley, Mofford & Durkee, LLP

(57) ABSTRACT

A semiconductor structure having mesa structure comprising: a lower semiconductor layer; an upper semiconductor layer having a higher band gap than, and in direct contact with, the lower semiconductor layer to form a two-dimension electron gas (2DEG) region between the upper semiconductor layer. The 2DEG region has outer edges terminating at sidewalls of the mesa. An additional electron donor layer has a band gap higher than the band gap of the lower layer disposed on sidewall portions of the mesa structure and on the region of the 2DEG region terminating at sidewalls of the mesa. An ohmic contact material is disposed on the electron donor layer. In effect, a sideway HEMT is formed with the electron donor layer, the 2DEG region and the ohmic contact material increasing the concentration of electrons (i.e., lowering ohmic contact résistance) all along the contact between the lower semiconductor layer and the electron donor layer.

4 Claims, 4 Drawing Sheets

(56) References Cited

OTHER PUBLICATIONS

D.F. Brown, A. Williams, K. Shinohara, A. Kurdoghlian, I. Milosavljevic, P. Hashimoto, R. Grabar, S. Burnham. C. Butler, P. Willadsen, M. Micovic, W-Band Power Performance of AlGaN/GaN DHFETs with Regrown n+ GaN Ohmic Contacts by MBE, HRL Laboratories, IEEE, 2011, pp. 19.3.1-19.3.4.

Notification of Transmittal of The International Search Report and The Written Opinion of the International Searching Authority, or the Declaration, PCT/US2013/044254, Sep. 6. 2013, 1 page.

International Search Report, PCT/US2013/044254 Sep. 6, 2013, 3 pages.

Written Opinion of the International Searching Authority, PCT/US2013/044254, Sep. 6, 2013, 4 pages.

* cited by examiner

GALLIUM NITRIDE DEVICES HAVING LOW OHMIC CONTACT RESISTANCE

TECHNICAL FIELD

This disclosure relates generally to galliumide (GaN) semiconductor devices and more particularly to gallium nitride (GaN) semiconductor devices having low ohmic contact resistance.

BACKGROUND

As is known in the art, second generation GaN HEMI devices (30-300 GHz) must have higher sheet charge in the channel, thinner and higher Al mole fraction AlGaN, InAlN, or InGaAlN Schottky contact layer thicknesses, and lower parasitic ohmic contact resistance (<0.2 ohm mm) than present the present devices.

One method used to form ohmic contacts for the first generation devices includes forming a Ti/Al/Barrier/Au with rapid thermal annealing at 850-900 C which generally result in devices having high ohmic contact resistance (>0.2 ohm mm), and lower yields for source/drain contact spacing of <=2 um.

One method suggested to produce devices having lower ohmic contact resistance is shown in FIGS. 1A-1C. Here, a substrate of, for example, silicon carbide (SiC) or silicon Si, has a gallium nitride (GaN) layer epitaxial formed on the substrate. A semiconductor layer (i.e., a Schottky contact layer) having a higher band gap that the GaN, (e.g., a layer of AlGaN, InAlN, or InGaAlN) is formed on the GaN layer resulting in two dimensional electron gas (2DEG) layer being produced at the interface between the GaN layer and the higher band gap Schottky contact layer. Next, a mask is formed on the Schottky contact layer and the exposed portions of the Schottky and GaN are etched in the source and drain contact regions as shown using any suitable dry etch. The resulting structure is a mesa shaped structure as shown in FIG. 1B. An ohmic contact layer of n+ doped GaN is deposited over the etched structure as shown in FIG. 1C. It is noted that the ends (i.e., edges) of the two dimensional electron gas (2DEG) layer now are in direct contact with the ohmic contact layer of n+ doped GaN. This method suffers from two issues: Firstly, etching and exposure of the two dimensional electron gas (2DEG) on the edges might compromise the carrier concentration and mobility of the electrons in the vicinity of the exposed etched surface. Secondly, electron injection at the source and collection of electrons at the drain is only through a thin (~50 Angstrom) contact between the two dimensional electron gas and the ohmic contact layer of n+ doped GaN.

SUMMARY

In accordance with the present disclosure, a semiconductor structure is provided having: a substrate and a mesa structure disposed on the substrate. The mesa structure includes: a lower semiconductor layer; an upper semiconductor layer having a different band gap from, and in direct contact with, the lower semiconductor layer to form a two-dimension electron gas region between the upper semiconductor layer, the two-dimension electron gas region having outer edges terminating at sidewalls of the mesa; an electron donor layer disposed on sidewall portions of the mesa structure and on the region of the two-dimension electron gas region terminating at sidewalls of the mesa; and an ohmic contact material disposed on the electron donor layer.

In one embodiment, a semiconductor structure is provided having: a substrate; and a mesa structure disposed on the substrate. The mesa structure includes: a lower semiconductor layer; an upper semiconductor layer having a higher band gap than, and in direct contact with, the lower semiconductor layer to form a two-dimension electron gas region between the upper semiconductor layer, the two-dimension electron gas region having outer edges terminating at sidewalls of the mesa; an additional semiconductor layer having a higher band gap than the lower semiconductor layer disposed on sidewall portions of the mesa structure, on the region of the two-dimension electron gas region terminating at sidewalls of the mesa and on and in direct contact with the lower semiconductor layer to form a two-dimension electron gas region between the additional layer and the lower semiconductor layer; and an ohmic contact material disposed on the electron donor layer, In one embodiment, a semiconductor structure is provided having: a substrate; and a mesa structure disposed on the substrate. The mesa structure includes: a lower semiconductor layer; an upper semiconductor layer having a different band gap from, and in direct contact with, the lower semiconductor layer; an electron donor layer disposed on sidewall portions of the mesa structure and on the region of the two-dimension electron gas region terminating at sidewalls of the mesa; and an ohmic contact material disposed on the electron donor layer.

In one embodiment, a semiconductor structure is provided having: a substrate and a mesa structure disposed on the substrate. The mesa structure comprising: a lower semiconductor layer; an upper semiconductor layer having a higher band gap from, and in direct contact with, the lower semiconductor layer to form a two-dimension electron gas to region between the upper semiconductor layer and the lower semiconductor layer, the two-dimension electron gas region having outer edges terminating at sidewalls of the mesa; and, an electron donor layer disposed on sidewall portions of the mesa structure and on the region of the two-dimension electron gas region terminating at sidewalls of the mesa; and an ohmic contact material disposed on the electron donor layer.

With such an arrangement, the electron donor layer is disposed between and in direct contact with the outer edges of the two-dimension electron gas region and the ohmic contact material, forming, in effect, what might be considered as a high electron mobility transistor (HEMT). The width of the regions for electron injection from the source ohmic contact material and collection of these injected electrons into, and then through, the two-dimension electron gas region, now is significantly increased resulting in lower contact resistance between the electron donor layer and two dimensional electron gas layer. In effect, the formation of this sideways HEMT increases the concentration of electrons all along the contact between the lower semiconductor layer and the electron donor layer results in lower ohmic contact resistance.

In one embodiment, ohmic contact material terminates at a top portion of the mesa structure.

In one embodiment, the lower semiconductor layer is GaN.

In one embodiment, the upper semiconductor layer includes AlN.

In one embodiment, the electron donor layer is n-type doped AlGaN.

In one embodiment, the ohmic contact material is n-type doped GaN.

In one embodiment, a gate electrode in Schottky contact with the upper semiconductor layer.

In one embodiment, an ohmic contact is in contact with the ohmic contact material.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
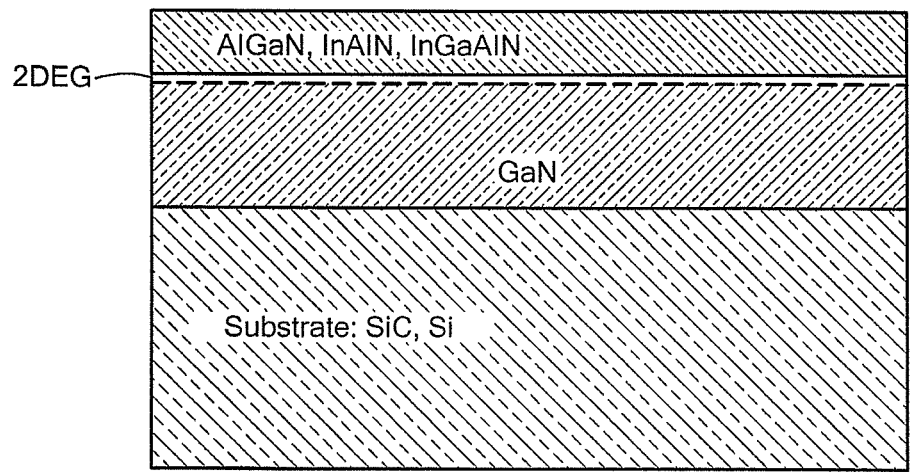
FIGS. 1A-1C are diagrammatical sketches showing the fabrication of a semiconductor structure at various stages in the fabrication thereof according to the PRIOR ART.
Figure 1B:
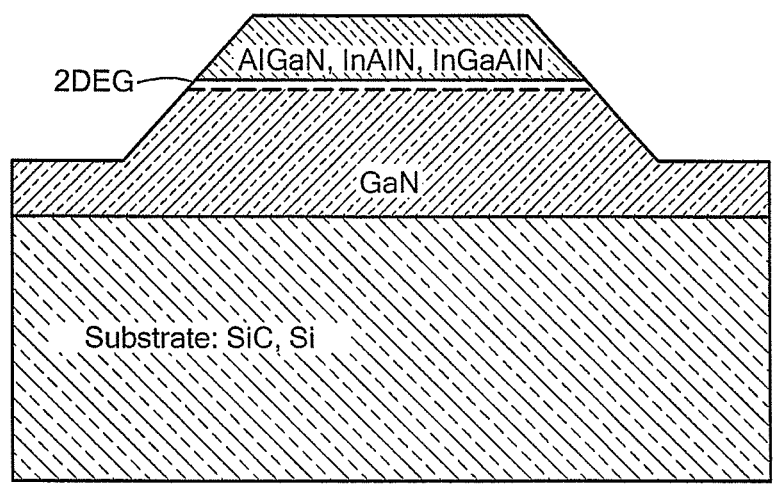
Figure 1C:
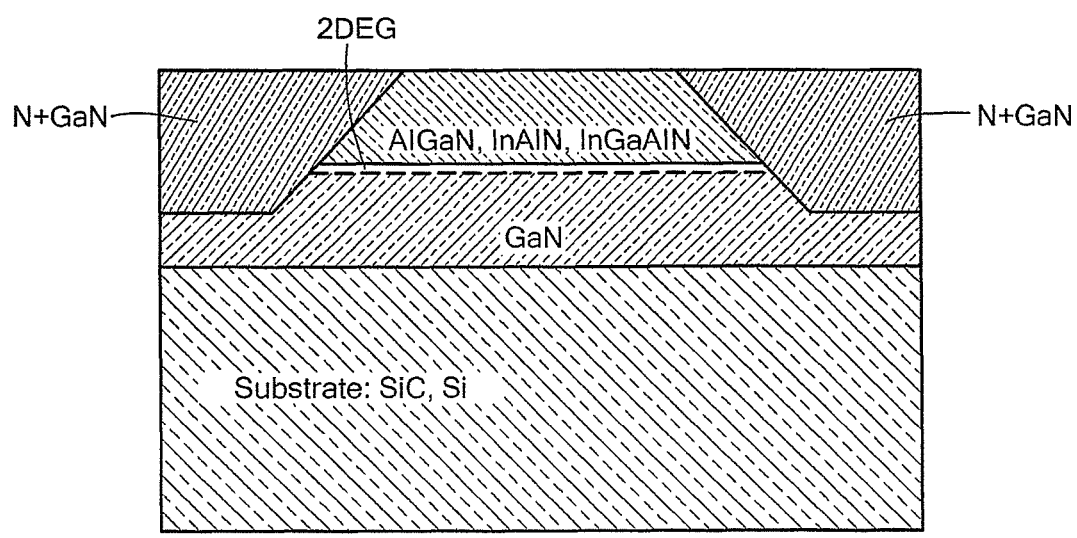
Figure 2A:
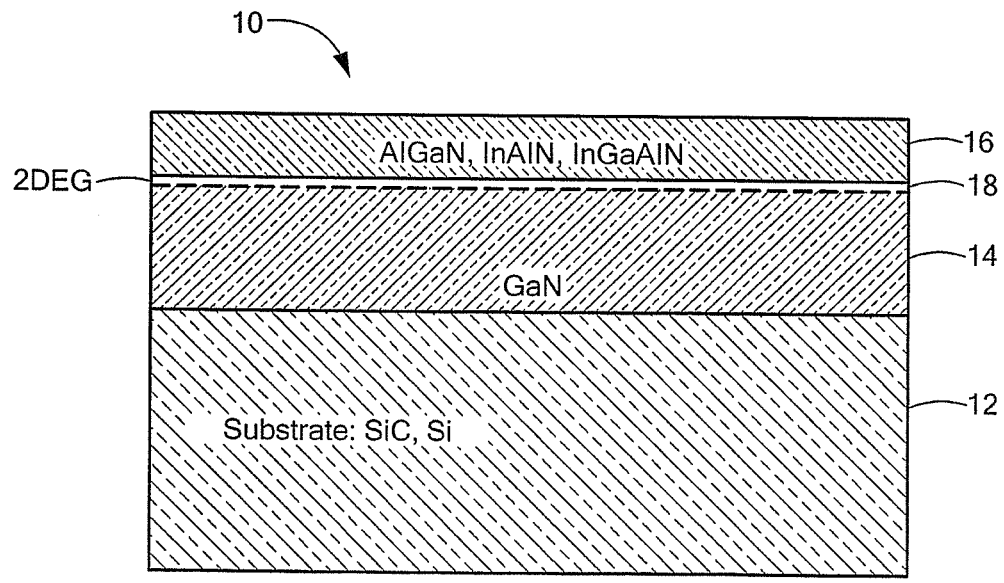
FIGS. 2A-2C are diagrammatical sketches showing the fabrication of a semiconductor structure at various stages in the fabrication thereof according to the disclosure.

Referring now to FIG. 2A, a semiconductor structure 10 is shows having: a substrate 12, here a semiconductor substrate of silicon carbide (SiC) or silicon (Si), for example. A lower layer 14 of gallium arsenide (GaN) is formed, by any conventional manner on the substrate 12. An upper layer 16 of aluminum gallium nitride (AlGaN), or indium aluminum nitride (InAlN) or indium gallium aluminum arsenide (InGaAlN) is formed on the lower layer of gallium arsenide (GaN), as shown. Because the upper layer has a higher band gap than the lower layer, a two dimensional electron gas (2DEG) region 18 is formed between the upper and lower layers 14, 16.

Figure 2B:
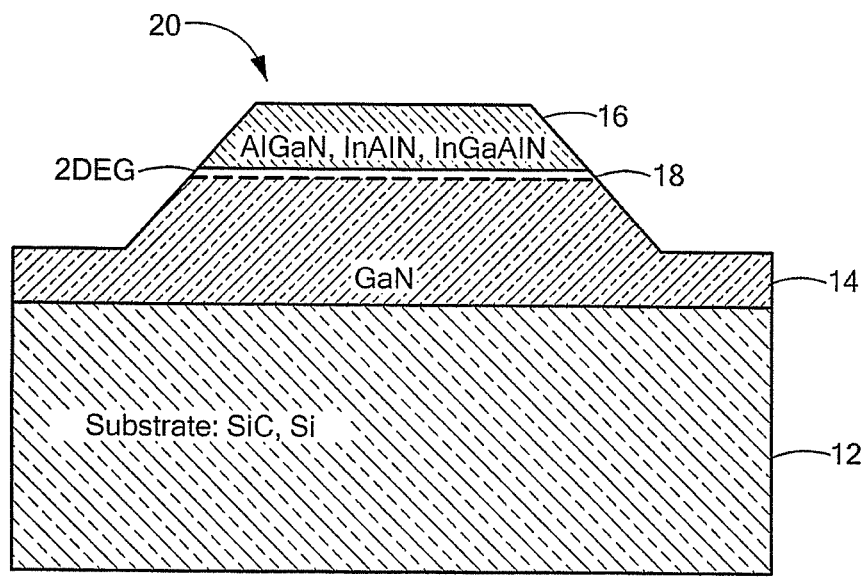

Next, the structure 10 shown in FIG. 2B is masked and dry etched to form a mesa structure 20 shown in FIG. 2B. Here, the structure 10 shown in FIG. 2A is etched to a depth from 300 Angstrom to 1000 Angstrom (preferably 600 Angstrom).

Figure 2C:
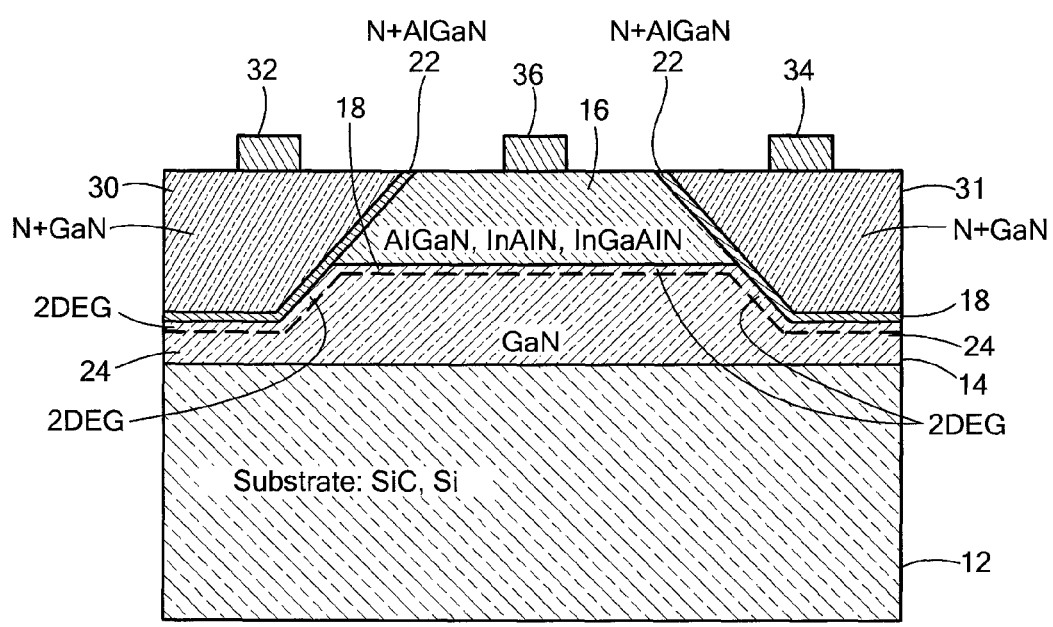

Next, as shown in FIG. 2C, an additional electron donor N+ layer 22 of AlGaN with Al concentration in the 5-30% (preferably 15-20%) is grown using, for example, molecular beam epitaxy (MBE) with a thickness of 30-200 Angstrom (preferably 50-100 Angstrom). Here, additional electron donor N+ layer 22 of AlGaN has a doping concentration of $10^{18}$-$5 \times 10^{19}$ electrons per $cm^3$. This additional electron donor N+ layer 22 of AlGaN having a higher band gap the band gap of the lower GaN layer 14 creates a two dimensional electron gas (2DEG) region 24 GaN on the sidewalls of the mesa structure 20. It is first noted that the additional electron donor N+ layer 22 of AlGaN forms a two-dimension electron gas region 24 between the lower semiconductor layer 14, the two-dimension electron gas region 16 having outer edges terminating at sidewalls of the mesa 20 and that the additional electron donor layer 22 is disposed on sidewall portions of the mesa structure 20 and on the region of the two-dimension electron gas region 22 terminating at sidewalls of the mesa 20. In effect a HEMT structure may be considered as being formed from a combination of doping (similar to GaAs pHEMTs) and spontaneous polarization all along the sidewall where it contacts the lower GaN layer 14. This is followed by growth of the additional GaN N+ ohmic contact layer 30 to a thickness of 200-1000 Angstrom (preferably 600 Angstrom).

It is noted that:

1. The additional electron donor N+ layer 22 of AlGaN has larger band gap than GaN is layer 14;

2. In effect a HEMT is formed at the interface between the higher band gap material of the additional electron donor N+ layer 22 of AlGaN and the GaN layer 14 and therefore electrons reside inside the GaN layer 14 at the interface; and 3. The additional electron donor N+ layer 22 of AlGaN has both a higher band gap than the GaN layer 22 and also has N+ doping.

The, source and drain contact regions 30, 31 here N+ GaN, are formed in the etched regions, as shown in FIG. 2C and terminate at the upper surface of the upper layer 16. Next, ohmic source and drain contacts 32, 34 are formed with the source and drain contact regions 30 and a gate contact 36 is formed within Schottky contact with the surface of the upper semiconductor layer 16 using any conventional processing.

The width of the regions for electron injection from the source contact regions 30 and collection of them at the drain contact region 31 is now significantly increased resulting in lower contact resistance between the re-grown additional layer of N+ layer 22 of AlGaN and two dimensional electron gas region 24 formed thereby. Thus, in the structure shown in FIG. 2C, there is direct contact between the source and drain contact regions 30, 31 through the two dimensional electron gas region 24 on the sideways of the mesa; i.e., as a result of the through etch and re-grown additional N+ layer 22 of AlGaN. Thus, a GaN HEMT is in effect formed on the sideways of the etched source/drain GaN regions 30, 31 through growth of the N+ AlGaN layer first before growing GaN N+ regions 30, 31. Formation of this sideway GaN HEMT increases the concentration of electrons all along the contact between the GaN layer 16 and AlGaN layer 18 and results in lower contact resistance.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A semiconductor structure, comprising:
a substrate;
a mesa structure disposed on a surface of the substrate, the mesa structure having slopped sidewalls oblique to the surface of the substrate, comprising:
an electron donor layer disposed on, and along, the sloped sidewall of the mesa structure;
a lower semiconductor layer having ends of an upper portion terminating at a lower portion of the electron donor layer;
an upper semiconductor layer having ends terminating at an upper portion of the electron donor layer, having a different band gap from, and in direct contact with, the lower semiconductor layer;
wherein a two-dimension electron gas region is formed having one portion disposed along a bottom portion of the upper semiconductor layer and another portion disposed along lower portions of the electron donor layer;
an ohmic contact material disposed on the electron donor layer;
wherein the upper semiconductor layer includes AlN;
wherein the lower semiconductor layer is GaN; and
wherein the electron donor layer is n-type doped AlGaN.

2. The semiconductor structure recited in claim 1 wherein the ohmic contact material is n-type doped GaN.

3. The semiconductor structure recited in claim 2 including a gate electrode in Schottky contact with the upper semiconductor layer.

4. The semiconductor structure recited in claim 3 including an ohmic contact in contact with the ohmic contact material.

* * * * *